United States Patent
Ji et al.

(10) Patent No.: US 10,859,883 B2
(45) Date of Patent: Dec. 8, 2020

(54) ARRAY SUBSTRATE, METHOD FOR MAINTAINING BREAKAGE THEREOF, AND DISPLAY APPARATUS

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Qiangqiang Ji, Beijing (CN); Guoquan Liu, Beijing (CN); Lu Che, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 180 days.

(21) Appl. No.: 16/072,599

(22) PCT Filed: Oct. 13, 2017

(86) PCT No.: PCT/CN2017/106122
§ 371 (c)(1),
(2) Date: Jul. 25, 2018

(87) PCT Pub. No.: WO2018/176799
PCT Pub. Date: Oct. 4, 2018

(65) Prior Publication Data
US 2020/0192169 A1    Jun. 18, 2020

(30) Foreign Application Priority Data

Apr. 1, 2017 (CN) .......................... 2017 1 0216158

(51) Int. Cl.
G02F 1/1362    (2006.01)
G02F 1/13      (2006.01)
H01L 27/12     (2006.01)

(52) U.S. Cl.
CPC ...... *G02F 1/136259* (2013.01); *G02F 1/1309* (2013.01); *G02F 1/136286* (2013.01);
(Continued)

(58) Field of Classification Search
CPC .. G02F 1/136259; G02F 1/133; G02F 1/1309; G02F 1/136286;
(Continued)

(56) References Cited

U.S. PATENT DOCUMENTS 8,384,837 B2 * 2/2013 Cheng ............... G02F 1/136259
349/192
8,582,067 B2    11/2013 Wang et al.
(Continued)

FOREIGN PATENT DOCUMENTS

CN    101202287 A    6/2008
CN    102023438 A    4/2011
(Continued)

OTHER PUBLICATIONS

International Search Report (including English translation) and Written Opinion (including English translation of Box V) for International Application No. PCT/CN2017/106122, dated Jan. 12, 2018, 17 pages.
Office Action, including Search Report, for Chinese Patent Application No. 201710216158.6, dated Mar. 28, 2019, 15 pages.

*Primary Examiner* — Charles S Chang
(74) *Attorney, Agent, or Firm* — Westman, Champlin & Koehler, P.A.

(57) ABSTRACT

The embodiments of the present disclosure propose an array substrate, a display apparatus, and a maintaining method. The array substrate comprises: a first signal line disposed in
(Continued)

a first direction; a second signal line disposed in a second direction different from the first direction; and a maintaining part disposed adjacent to an intersection region of the first signal line which overlaps with the second signal line, electrically connected to a common electrode line, and is electrically insulated from the first signal line.

19 Claims, 7 Drawing Sheets

(52) U.S. Cl.
CPC .............. *H01L 27/1244* (2013.01); *G02F 2001/136263* (2013.01); *G02F 2201/121* (2013.01)

(58) Field of Classification Search
CPC ... G02F 2001/136263; G02F 2201/121; H01L 27/1244
USPC .............................................. 349/54–55, 192
See application file for complete search history.

(56) References Cited

U.S. PATENT DOCUMENTS

| | | | |
|---|---|---|---|
| 8,767,158 | B2 | 7/2014 | Wang et al. |
| 9,678,399 | B2 | 6/2017 | Hua et al. |
| 2001/0013910 | A1* | 8/2001 | Ahn ................. G02F 1/1368 349/54 |
| 2006/0050219 | A1* | 3/2006 | Lee ................ G02F 1/136259 349/141 |
| 2006/0077313 | A1 | 4/2006 | Liu et al. |
| 2008/0135857 | A1 | 6/2008 | Kim et al. |
| 2011/0097836 | A1 | 4/2011 | Kim et al. |

FOREIGN PATENT DOCUMENTS

| | | |
|---|---|---|
| CN | 102156359 A | 8/2011 |
| CN | 102468308 A | 5/2012 |
| CN | 104965325 A | 10/2015 |
| CN | 105892186 A | 8/2016 |
| CN | 106802526 A | 6/2017 |
| JP | 2004-118016 A | 4/2004 |

\* cited by examiner

ARRAY SUBSTRATE, METHOD FOR MAINTAINING BREAKAGE THEREOF, AND DISPLAY APPARATUS

CROSS-REFERENCE TO RELATED APPLICATION(S)

This application is a Section 371 National Stage Application of International Application No. PCT/CN2017/106122 filed on Oct. 13, 2017 and entitled "ARRAY SUBSTRATE, METHOD FOR MAINTAINING BREAKAGE THEREOF, AND DISPLAY APPARATUS", which claims priority to the Chinese Patent Application No. 201710216158.6, filed on Apr. 1, 2017, which is incorporated herein by reference in its entirety.

TECHNICAL FIELD

The present disclosure relates to the field of circuit design, and more particularly, to an array substrate, a display apparatus comprising the same, and a method for maintaining a breakage of the array substrate.

BACKGROUND

A Thin Film Transistor (TFT) Liquid Crystal Display (LCD) apparatus is an LCD which enhances the image quality (for example, the addressing capability and the contrast) by using the TFT technology.

However, during processes of producing, using, and maintaining the TFT LCD apparatus, there is often a phenomenon of an open circuit (also known as an breaking circuit or circuit breakage) in a circuit thereof, which in turn causes failures in pixels in the display apparatus which are associated with the breakage, such as bad pixels in the display apparatus etc.

SUMMARY

In order to at least partially solve or alleviate the above problems, there are provided an array substrate, a display apparatus comprising the same, and a method for maintaining a breakage of the array substrate according to an embodiment of the present disclosure.

According to a first aspect of the present disclosure, there is proposed an array substrate. The array substrate comprises: a first signal line disposed in a first direction; a second signal line disposed in a second direction different from the first direction, wherein the second signal line overlaps with the first signal line to form an intersection region; and a maintaining part electrically connected to a common electrode line, and is electrically insulated from the first signal line.

In some embodiments, the first signal line is a data line and the second signal line is a gate line. In some embodiments, the maintaining part is formed by adding an isolated gate line when manufacturing the gate line by a gate mask. In some embodiments, the maintaining part is disposed in a gate layer. In some embodiments, the maintaining part is disposed in the gate layer below the data line. In some embodiments, the maintaining part and the common electrode line are made of the same material.

In some embodiments, the maintaining part is configured to, when a breakage of the first signal line occurs in the intersection region, be electrically connected to a portion of the first signal line on one side of the breakage of the first signal line when the breakage occurs in the intersection region, and be electrically connected to a portion of the first signal line on the other side of the breakage through an electrical connection with the common electrode line.

In some embodiments, the electrical connection is realized by welding.

In some embodiments, the common electrode line has a grid structure including at least first common lines in the first direction and second common lines in the second direction intersecting with each other, wherein the maintaining part is electrically connected to a first common line.

In some embodiments, a connection area of the maintaining part and the first common line is away from a second common line by a distance less than ⅓ of a pixel length in the first direction.

According to a second aspect of the present disclosure, there is proposed a display apparatus. The display apparatus comprises the array substrate according to the first aspect of the present disclosure.

According to a third aspect of the present disclosure, there is proposed a method for maintaining a breakage of the first signal line in the array substrate according to the first aspect of the present disclosure. The method comprises: electrically connecting a portion of the first signal line on one side of the breakage to the maintaining part; electrically connecting a portion of the first signal line on the other side of the breakage to the common electrode line; and electrically insulating a portion of the common electrode line in a region including a connection area of the maintaining part and the common electrode line and a connection area of the first signal line and the common electrode line from the surroundings.

In some embodiments, the electrical insulation is realized by cutting the portion of the common electrode line in the region from other portions of the common electrode line.

In some embodiments, the region is a square region with a side length of 50 microns.

BRIEF DESCRIPTION OF THE ACCOMPANYING DRAWINGS

The above and other purposes, features and advantages of the present disclosure will become more apparent from the preferred embodiments of the present disclosure with reference to the accompanying drawings, in which.

DETAILED DESCRIPTION

The preferred embodiments of the present disclosure are described in detail below with reference to the accompanying drawings, and details and functions which are not necessary for the present disclosure are omitted in the description to avoid confusion of the understanding of the present disclosure. In the present specification, various embodiments described below for describing the principles of the present disclosure are merely illustrative and should not be construed as limiting the scope of the present disclosure. The following description with reference to the accompanying drawings is used to fully understand exemplary embodiments of the present disclosure, which are defined by the claims and their equivalents. The description below comprises numerous specific details to facilitate the understanding, but these details are considered to be merely exemplary. Accordingly, it will be apparent to those of ordinary skill in the art that various changes and modifications can be made to the embodiments described herein without departing from the scope and spirit of the present disclosure. In addition, descriptions of well-known functions and constructions are omitted for clarity and conciseness. Further, the same reference signs are used for the same or similar functions and operations throughout the accompanying drawings. In addition, in the accompanying drawings, various parts are not necessarily drawn to scale. In other words, relative sizes, lengths, etc. of the various parts in the accompanying drawings do not necessarily correspond to actual ratios.

The present disclosure will be described in detail below by taking a scene in which the present disclosure is applied to a TFT LCD as an example. However, the present disclosure is not limited thereto, and the present disclosure is also applicable to any other suitable circuit design including, but not limited to, any circuit in which a breakage occurs. In addition, although the technical solutions according to the embodiments of the present disclosure are described in detail below by taking a situation in which a breakage of data lines occurs as an example, the present disclosure is also applicable to other breakage situations in a case of appropriate modifications and changes as would occur to those skilled in the art, for example, a situation in which a breakage of scanning (gate) lines occurs, etc.

In the present disclosure, the terms "include" and "including" and their derivatives are intended to be inclusive and not limiting; and the term "or" is inclusive, meaning "and/or".

Figure 1:
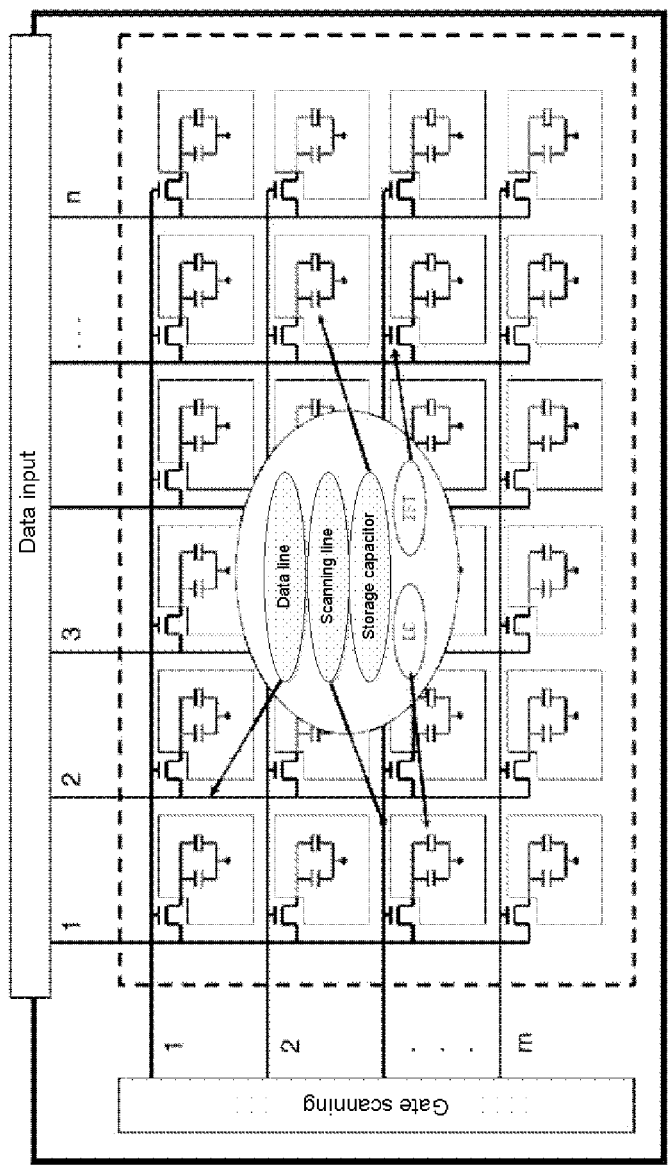
FIG. 1 is an equivalent circuit diagram illustrating a TFT LCD according to the related art.

Firstly, a structure and a principle of a TFT LCD will be briefly described with reference to FIG. 1. FIG. 1 is an equivalent circuit diagram illustrating a TFT LCD according to the related art.

As shown in FIG. 1, an equivalent circuit of the TFT LCD may comprise a plurality of pixel circuits arranged in an array. Each of the pixel circuits may have a TFT, a storage capacitor, and Liquid Crystal (LC) corresponding thereto. The same row of various pixel circuits are under control of the same scanning line (hereinafter sometimes referred to as a gate line), and the same column of various pixel circuits are under control of the same data line (hereinafter sometimes referred to as a source line). The scanning lines and the data lines are generally disposed in different directions, and more specifically, are generally disposed in directions which are substantially perpendicular to each other.

When the TFT LCD is in operation, a high level is sequentially input to various scanning lines in order (for example, a scanning direction is from top to bottom, that is, from a scanning line 1 to a scanning line m), so that all TFTs in a pixel row corresponding to each scanning line are turned on at the same time. When the TFTs are turned on, each pixel circuit in the same row may deflect or may not deflect liquid crystal according to an input in a corresponding data line, to cause backlight to pass through or not to pass through a liquid crystal layer, and finally cause a corresponding pixel on the display apparatus to emit light or not to emit light.

More specifically, when a high level is applied to a gate of a TFT so that the TFT is turned on, if an input of a corresponding data line (source line) is at a high level at this time, LC in a corresponding pixel circuit is deflected, and backlight passes through the liquid crystal layer, so that a corresponding pixel emits light, and a corresponding storage capacitor is charged at the same time. Then, when a next row of pixels is scanned, a low level is input to a gate line of the current row of pixels, and at this time, each TFT in the row is in a turn-off state. In this case, if a certain pixel is previously in a light-emitting state, that is, LC is deflected and a storage capacitor is in a charged state, although a TFT is turned off and no new current enters therein at this time, the storage capacitor may still supply power to the LC, so that the LC continues to remain in a deflected state and cause the corresponding pixel to emit light, to wait for scanning the next time. For a pixel which is not previously in a light-emitting state, the pixel remains in a non-light-emitting state.

Figure 2:
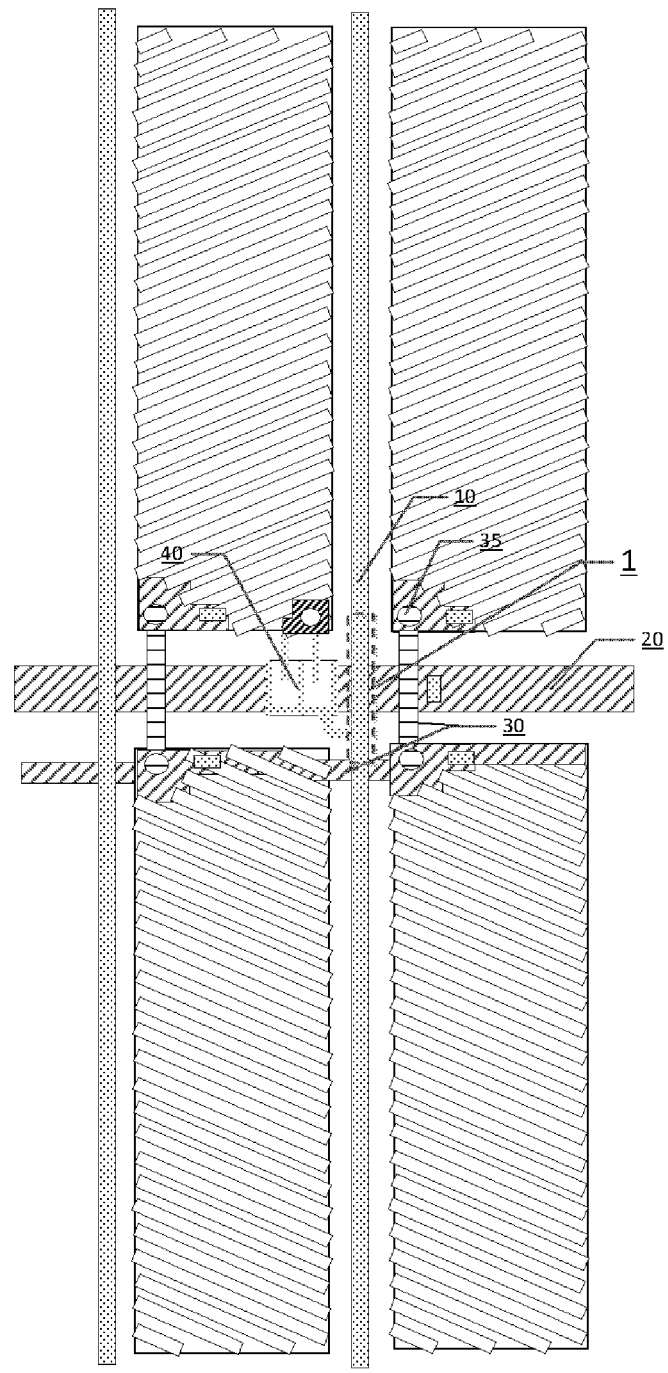
FIG. 2 is a partially enlarged schematic view illustrating an exemplary array substrate according to an embodiment of the present disclosure.
Figure 3:
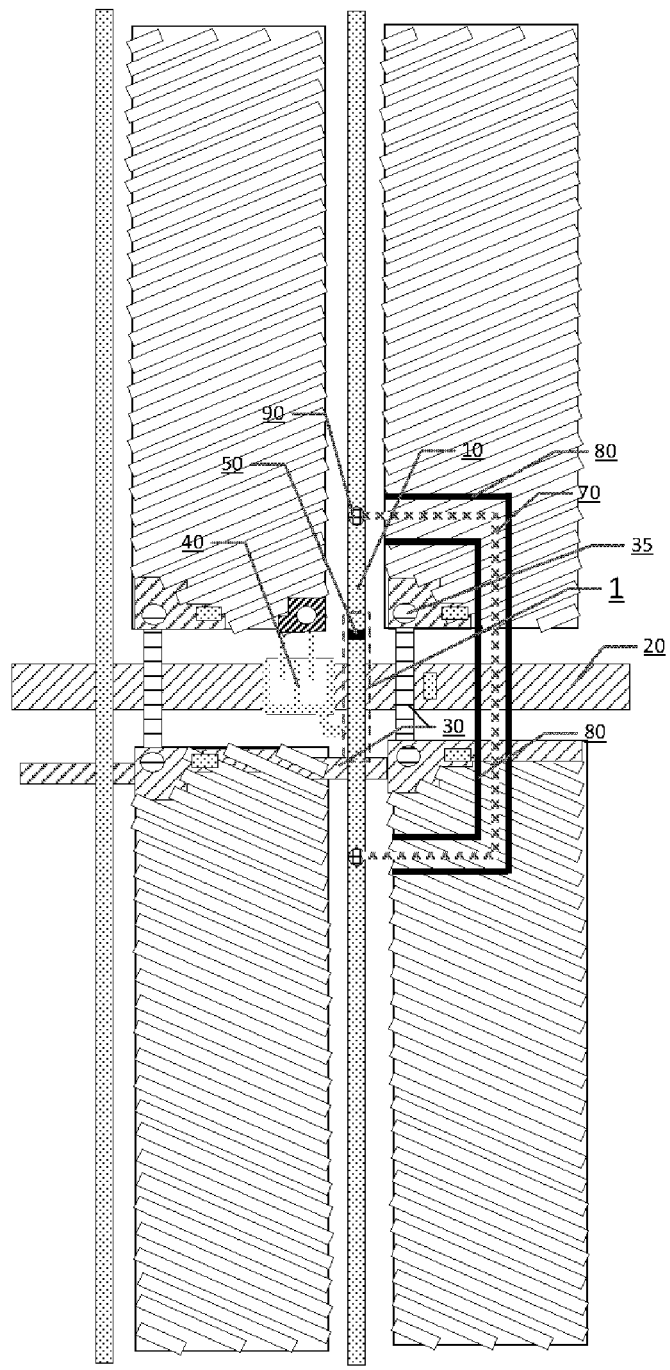
FIG. 3 is a partially enlarged schematic view illustrating an exemplary maintained array substrate according to an embodiment of the present disclosure.
Figure 5:
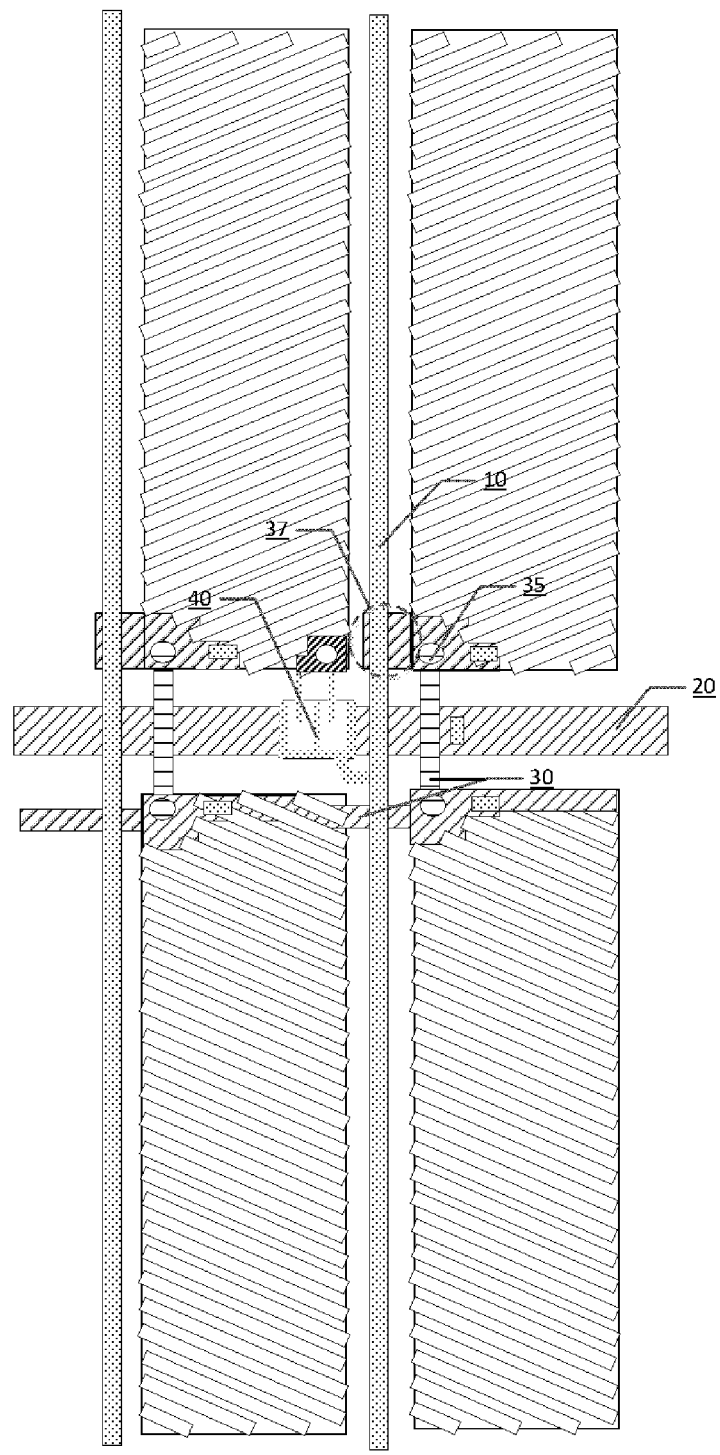
FIG. 5 is a partially enlarged schematic view illustrating an exemplary array substrate according to another embodiment of the present disclosure.
Figure 6:
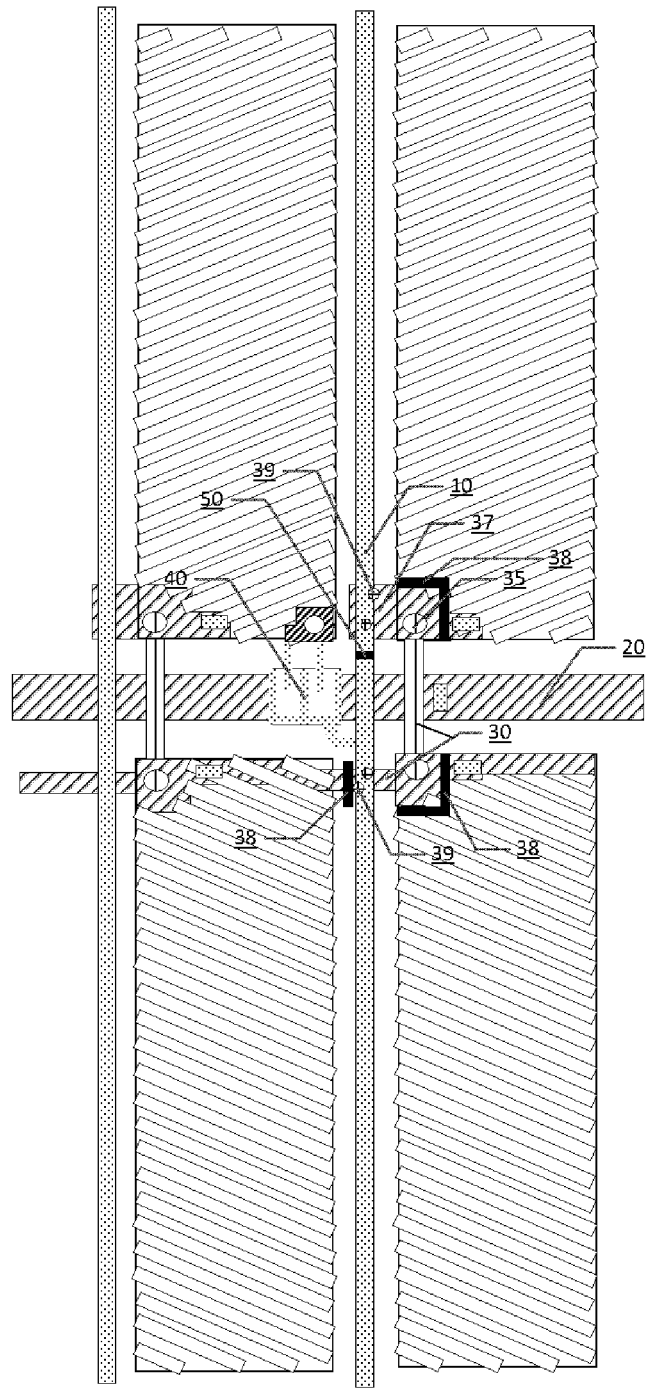
FIG. 6 is a partially enlarged schematic view illustrating an exemplary maintained array substrate according to another embodiment of the present disclosure.

As described above, when an array substrate of such a TFT LCD is produced, used, or maintained, there may be a situation in which a breakage of a data line occurs, for example, a breakage 50 of a data line in FIG. 3 or a breakage 50 of a data line in FIG. 6. In order to at least partially solve or alleviate this problem, there are proposed an array substrate, a display apparatus, and a method for maintaining a breakage according to an embodiment of the present disclosure. This will be described in detail below with reference to FIGS. 2 to 7.

Firstly, an arrangement of an exemplary array substrate according to an embodiment of the present disclosure will be described in detail with reference to FIGS. 2 to 3. FIG. 2 is a partially enlarged top view illustrating an exemplary array substrate according to an embodiment of the present disclosure. A partial portion of the array substrate shown in FIG. 2 may comprise a data line 10, a scanning line 20, a common electrode line 30, a common electrode hole 35, and a TFT 40. The common electrode hole 35 serves as a via hole through which a common electrode conductor may pass. As an insulating layer above the common electrode hole 35 is etched away, all the common electrodes may be connected in a mesh shape by placing isolated pixel electrodes on all the holes.

Further, as shown in FIG. 2, a portion of the data line 10 which intersects the scanning line 20 in a top view and extending portions of the data line 10 on two sides of the intersection portion in an extending direction thereof may be referred to as an intersection region 1 of the data line, or may be referred to as a portion of the data line 10 which overlaps with the scanning line 20. Although the intersection region 1 is illustrated as a rectangle in the top view of FIG. 2, the present disclosure is not limited thereto. In fact, the intersection region 1 may have any shape in the top view, such as a square, a triangle, a trapezoid, or any other regular or irregular polygon, etc., depending partly on a shape of the data line itself and partly on a size of the intersection region 1. Further, although the intersection region 1 is shown in FIG. 2 as having a length three times a width of the scanning line, that is, the intersection region 1 extends from a position upward away from the scanning line by the width of the scanning line to a position downward away from the scanning line by the width of the scanning line, the present disclosure is not limited thereto. In fact, the length of the intersection region may have any other size. It should be understood by those skilled in the art that the intersection region 1 may have any shape and/or size without affecting the technical effects of the present disclosure as described below.

FIG. 3 is a partially enlarged schematic view illustrating an exemplary maintained array substrate according to an embodiment of the present disclosure. The embodiment in FIG. 3 differs from the embodiment shown in FIG. 2 in that, in the embodiment of FIG. 3, a breakage (i.e., data line intersection region DO) 50 of the data line 10 occurs in the intersection region 1. For example, the breakage 50 of the data line 10 may occur due to conditions such as a production process or improper use etc.

In order for the data line 10 to still operate normally, in some embodiments, tungsten powder deposition 70 bypassing the DO 50 may be formed by depositing tungsten powder in a source/drain layer (hereinafter sometimes simply referred to as an S-D layer or an SD layer). In addition, in order to prevent the formed tungsten powder deposition 70 from being short-circuited with other surrounding conductors (for example, the scanning line 20 and the common electrode line 30), an ITO region 80 surrounding the tungsten powder deposition 70 needs to be removed, so that the tungsten powder deposition 70 is electrically insulated from other conducting layers. In this case, the data line 10 may still operate normally.

However, when the DO is maintained in the SD layer, the tungsten powder may diffuse into the common electrode hole 35, thereby resulting in, for example, frequent occurrence of "data line-common electrode line short circuit" (hereinafter sometimes referred to as DCS). If such a DCS exists after the maintenance, when X-rays are used to check a maintenance effect of the SD layer, a maintenance personnel may see thin X dark lines, which are extremely easy to miss and leave the defects to a user terminal, thereby resulting in a quality risk.

Figure 4:
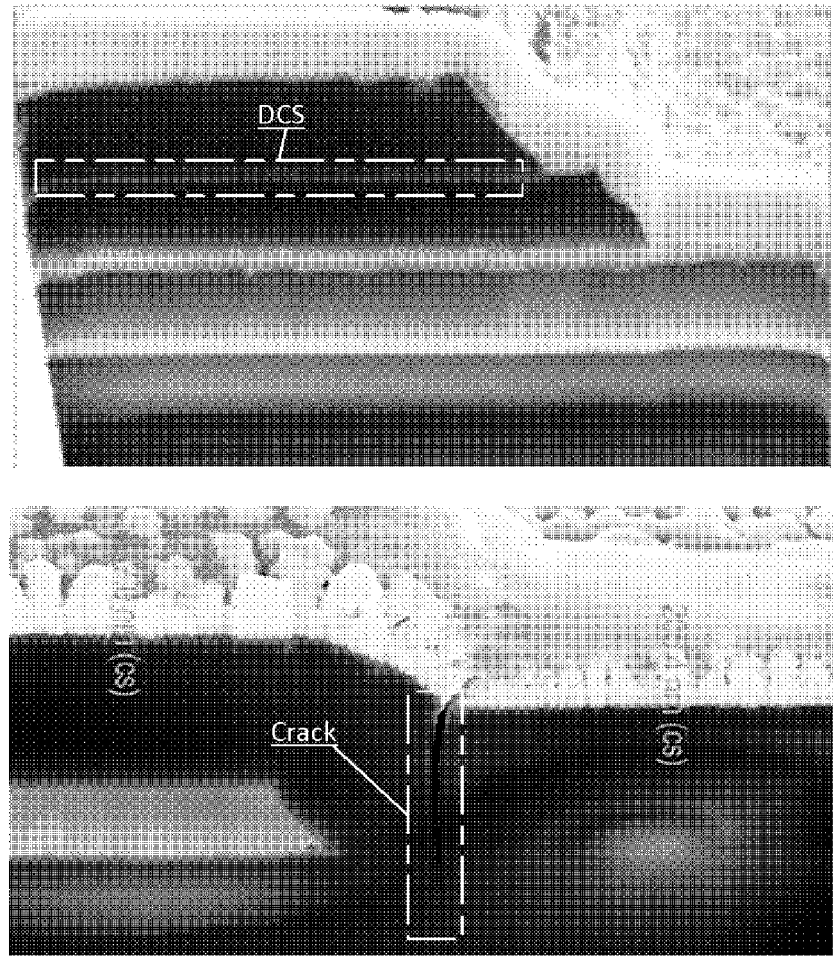
FIG. 4 is an X-ray cross-sectional view illustrating a portion of the exemplary maintained array substrate corresponding to FIG. 3.

FIG. 4 is an X-ray cross-sectional view illustrating a partial portion of the exemplary maintained array substrate corresponding to FIG. 3. It can be more clearly seen from an upper cross-sectional view of FIG. 4 that after the maintenance in the SD layer, the tungsten powder diffuses into the common electrode hole (Com hole), which causes the occurrence of the data line-common electrode line short circuit (DCS) and causes a defect in a corresponding pixel.

Further, in some other embodiments, as shown in FIG. 3, the tungsten powder deposition 70 bypassing the DO 50 may also be formed in a final layer (i.e., a layer formed by a final procedure of a process for manufacturing a TFT array substrate) by using tungsten powder. In addition, in order to prevent the formed tungsten powder deposition 70 from being short-circuited with other surrounding conductors (for example, the scanning line 20 and the common electrode line 30), the ITO region 80 surrounding the tungsten powder deposition 70 needs to be removed, so that the tungsten powder deposition 70 is electrically insulated from other conducting layers. In this case, the data line 10 may still operate normally.

Although the maintenance in the final layer can avoid the DCS problem, there are other problems during the maintenance in the final layer. For example, if the tungsten powder deposition has high energy, it is easy to cause breakdown of a passivation layer (PVX) when the tungsten power is across gates or common electrodes, thereby resulting in cracks, and the tungsten powder deposition itself may also have a crack phenomenon (for example, as more clearly shown in a lower cross-sectional view in FIG. 4). In this case, DO/DCS occurs frequently in a product in the downstream of a production and maintenance process (i.e., a side in the process which is closer to a user), which is also extremely easy to miss and leave the defects to a user terminal, thereby resulting in a quality risk. However, if the tungsten powder deposition has low energy, adhesion of the tungsten powder is reduced, which may result in failure in the maintenance and failure in debugging (for example, parameter debugging). In addition, after the tungsten powder deposition is performed, the surrounding ITO needs to be stripped (otherwise, defects in all the pixels at the back end occur). At this time, the ITO is damaged, which may also cause defects in a lot of pixels at the back end.

Therefore, in the embodiments shown in FIGS. 2 and 3, although the maintenance of the breakage of the data line can be performed in, for example, the SD layer or the final layer, there may still be a problem of defects in the data line after the maintenance, thereby causing the corresponding pixel to be a bad pixel.

In order to at least partially solve or alleviate these problems, an arrangement of an array substrate according to another embodiment of the present disclosure will be described in detail below with reference to FIGS. 5 and 6.

FIG. 5 illustrates a partially enlarged schematic view of an exemplary array substrate according to another embodiment of the present disclosure. One of the main differences between the embodiment shown in FIG. 5 and the embodiment shown in FIG. 2 is a portion indicated by a dashed circle in FIG. 5. As shown in FIG. 5, in addition to various elements shown in FIG. 2, the array substrate is further provided with a maintaining part 37.

In some embodiments, the maintaining part 37 may be a conductor disposed adjacent to an intersection region (for example, similar to the intersection region 1 shown in FIGS. 2 and 3) of the data line 10. More specifically, in some embodiments, the maintaining part 37 may be a conductor disposed below the intersection region of the data line 10. However, the embodiments of the present disclosure are not limited thereto. In fact, the maintaining part 37 may be provided as long as it is adjacent to any position where a breakage may occur.

Further, the maintaining part 37 may be electrically connected to the common electrode line 30. In some embodiments, the common electrode line 30 may have a grid structure (such as the embodiment with respect to FIG. 5). The grid structure includes at least first common lines in the first direction (i.e. parallel to the data line 10 in FIG. 5, as the vertical line designated by 30) and second common lines in the second direction (i.e. parallel to the gate line 20 in FIG. 5, as the horizontal line designated by 30). The first common lines and the second common lines intersect with each other. In the embodiment of FIG. 5, the maintaining part 37 is electrically connected to a first common line of the common electrode line 30.

In some embodiments, a connection area of the maintaining part 37 and the first common line may be away from a second common line (i.e. the horizontal line designated by 30 in FIG. 5) by a distance less than a fraction (e.g. ⅓) of a pixel length in the first direction. In subsequent operations, the connection area of the maintaining part 37 and the first common line will be insulated (e.g cut) from the surroundings. This will cause the pixel electrode to be cut in two two parts, e.g. as shown by a cutting region 38 in subsequent FIG. 6. If the cutting region 38 is too large, the cut pixel may become a bad pixel. Therefore, the distance between the maintaining part 37 and the nearby second common line is limited as less than ⅓ of the pixel length to reduce the possibility of bad pixels.

Further, the maintaining part 37 may be electrically insulated from the data line 10. Although it appears that the data line 10 partly overlaps with the maintaining part 37 in the top view of FIG. 5, the data line 10 and the maintaining part 37 are actually located in different layers and are not in direct contact. For example, the data line 10 may be located in a source/drain layer and may be electrically connected to a source of the TFT 40. In contrast, the maintaining part 37 may be located in a gate layer to be electrically insulated from the data line 10. In the present embodiment, the gate layer refers to a layer where gates and gate lines are located.

Further, the maintaining part 37 and the common electrode line 30 electrically connected thereto may be made of the same material. More specifically, in some embodiments, in the production of the array substrate, an order in which various layers are manufactured may be, for example, a first ITO layer, the gate layer, the source/drain layer, a PVX layer and a second ITO layer according to a production process. As an example, the first ITO layer may serve as a common electrode layer, the gate layer comprises gates and gate lines electrically connected to the gates, the source/drain layer comprises sources and drains and signal lines disposed in the same layer as that of the sources and the drains, the PVX layer may serve as an insulating layer or a passivation layer, and the second ITO layer may serve as the pixel electrodes. In the present embodiment, only some exemplary structures are given, the structure of the array substrate is not limited thereto, and those skilled in the art can design the structure of the array substrate and the corresponding production process according to practical requirements. At this time, in order to manufacture the maintaining part 37, the maintaining part 37 may be formed by adding an isolated gate line when manufacturing the gate line by a gate mask. In this embodiment, the maintaining part is substantially parallel to the second signal line (i.e. the gate line).

FIG. 6 is a partially enlarged schematic view illustrating an exemplary maintained array substrate according to another embodiment of the present disclosure. When the breakage of the first signal line occurs in the intersection region, the maintaining part 37 in the array substrate is made electrically connected to a portion of the first signal line on one side of the breakage of the first signal line, and electrically connected to a portion of the first signal line on the other side of the breakage through an electrical connection with the common electrode line.

As shown in FIG. 6, when a breakage 50 of the data line 10 occurs in the intersection region, a portion of the data line 10 on one side of the breakage 50 may be electrically connected to the maintaining part 37 (for example, a portion of the data line 10 on an upper side of the breakage 50 in FIG. 6), and a portion of the data line 10 on the other side of the breakage 50 may be electrically connected to the common electrode line 30. Meanwhile, a portion of the common electrode line 30 which is adjacent to the intersection region 1 (for example, in a square region including the intersection region 1 with a side length of 50 microns) may be electrically insulated from the surroundings. In the embodiment shown in FIG. 6, electrical connections (for example, welding points or lead welding 39) may be realized by welding. For example, portions of the data line 10 on two sides of the breakage may be welded to the maintaining part 37 and the common electrode line 30 respectively by melting metal under the laser thermal effect. Moreover, in the embodiment shown in FIG. 6, electrical insulation (for example, a cutting region 38) may be realized by cutting. For example, the cutting may be performed at a position of a via hole (for example, the common electrode hole 35) near a position of the pixel electrode, and both the uppermost pixel electrode and the lower common electrode are cut apart at the time of cutting, thereby realizing metal isolation of the common electrode at the position of the via hole.

In this way, the maintenance of the breakage of the data line may be realized with little damage to the ITO by using the existing common electrode line through simple welding and cutting instead of using tungsten powder deposition. According to the solutions of the present embodiment, there is no other process risk and no influence on the product yield, the maintenance has a high success rate, and the occurrence rate of defects in the bright spots after the maintenance is significantly reduced.

Further, although the solutions according to some embodiments of the present disclosure are explained in detail in the embodiments of FIGS. 2 to 6 by taking the "data line" being the first signal line as a specific example, the present disclosure is not limited thereto. In fact, the "data line" and the "gate line" in the above embodiments may be interchanged, so that the maintenance of the breakage of the "gate line" can be realized.

Next, an exemplary method for maintaining a breakage will be described in detail in conjunction with FIG. 7.

Figure 7:
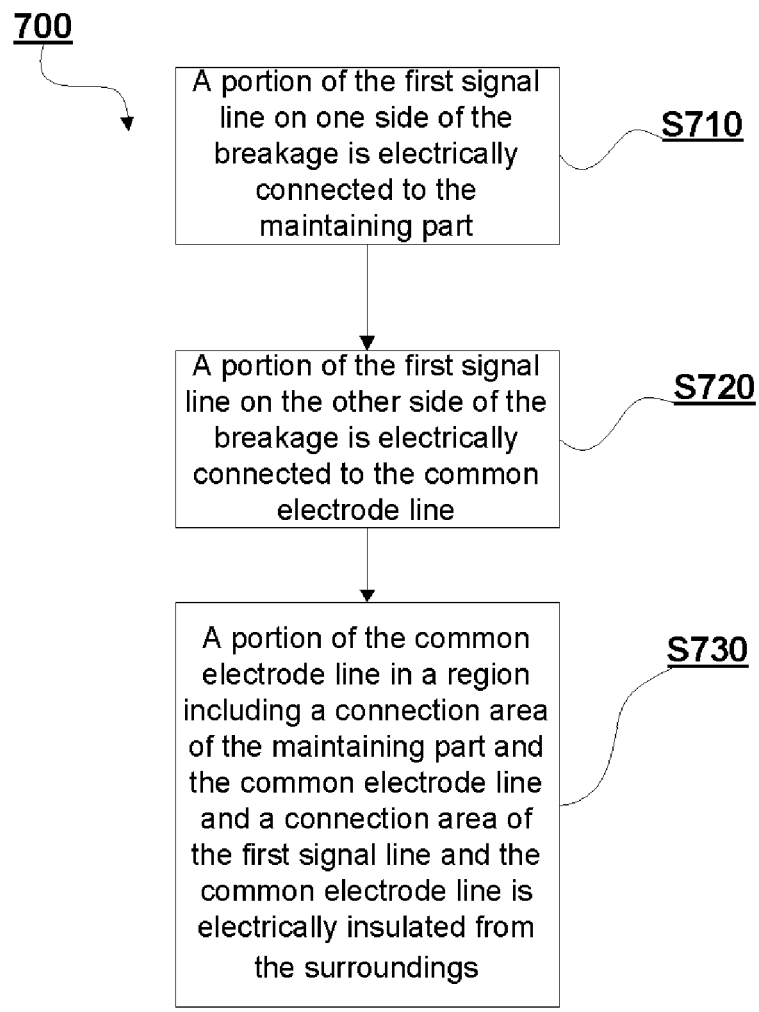
FIG. 7 is a flowchart illustrating an exemplary method for maintaining a breakage according to another embodiment of the present disclosure.

FIG. 7 is a flowchart illustrating an exemplary method 700 for maintaining a breakage of a first signal line (for example, a data line) according to another embodiment of the present disclosure. The method 700 is applicable to the array substrate shown in FIG. 5. The method in FIG. 7 starts at step S710.

In step S710, a portion of the first signal line on one side of the breakage is electrically connected to the maintaining part.

In step S720, a portion of the first signal line on the other side of the breakage is electrically connected to the common electrode line.

In step S730, a portion of the common electrode line in a region is electrically insulated from the surroundings. In one embodiment, the region is a square region with a side length of 50 microns. As shown in FIG. 6, the region may include the connection area of the maintaining part 37 and the common electrode line and the connection area of the first signal line (e.g. data line 10) and the common electrode line.

In the embodiment where the common electrode line 30 has a grid structure (as shown in FIGS. 5 and 6), and the breakage is located between the maintaining part 37 and a second common line of the common electrode line 30, the method 700 may be adapted as below:

electrically connecting a portion of the first signal line on one side of the breakage to the maintaining part;

electrically connecting a portion of the first signal line on the other side of the breakage to the second common line; and electrically insulating a portion of the common electrode line in a region a connection area of the maintaining part and the first common line, a connection area of the first signal line and the second common line, and an intersection area of the first common line and the second common line from the surroundings.

In some embodiments, the first signal line may be a data line and the second signal line may be a gate line. In some embodiments, the maintaining part may be formed by adding an isolated gate line when manufacturing the gate line by a gate mask. With such a manufacturing method, the manufacturing of the maintaining part may be integrated with a process in the related art to avoid or reduce the increase in cost due to the change in the process.

In some embodiments, the electrical connections may be realized by welding the maintaining part to a portion of the first signal line on one side of the breakage and welding the common electrode line to a portion of the first signal line on the other side of the breakage. Further, the electrical insulation may be realized by cutting a portion of the common electrode line which is adjacent to the intersection region (for example, in a square region including the intersection region with a side length of 50 μm) from other portions of the common electrode line. In this way, each electrical connection and electrical insulation can be realized, which can avoid the short circuit or cracks during maintenance using the tungsten powder, avoid the damage to each ITO layer, and improve the success rate of the maintenance. In addition, as welding and cutting may be performed using welding and cutting functions of devices in the related art, the cost is also reduced.

In some embodiments, the maintaining part 37 may be disposed in a gate layer. In some embodiments, the maintaining part 37 may be disposed in the gate layer below the corresponding data line 10. The maintaining part is disposed in the gate layer below the data line, so that the maintaining part 37 can be formed by adding an isolated gate line when manufacturing the gate line by a gate mask, which is compatible with the process flow in the related art and avoids the increase in cost due to the change in the process.

In some embodiments, the maintaining part 37 and the common electrode line 30 may be made of the same material. The maintaining part is realized using the same material as that of the common electrode line, which can also reduce the increase in cost due to the change in the process.

The present disclosure has been described hereto in connection with the preferred embodiments. It should be understood that various other changes, substitutions and additions can be made by those skilled in the art without departing from the spirit and scope of the present disclosure. Therefore, the scope of the present disclosure is not limited to the specific embodiments described above, but is defined by the appended claims.

Further, functions described herein as being implemented by pure hardware, software, and/or firmware may also be implemented by means of dedicated hardware, a combination of general-purpose hardware and software, etc. For example, functions described as being implemented by dedicated hardware (for example, Field Programmable Gate Array (FPGA), Application Specific Integrated Circuit (ASIC), etc.) may be implemented by a combination of general purpose hardware (for example, Central Processing Unit (CPU), or Digital Signal Processor (DSP)) and software, and vice versa.

We claim:

1. An array substrate, comprising:
   a first signal line disposed in a first direction;
   a second signal line disposed in a second direction different from the first direction, wherein the second signal line overlaps with the first signal line to form an intersection region; and
   a maintaining part, located at a side of the intersection region, the maintaining part is electrically connected to a common electrode line, and is electrically insulated from the first signal line,
   wherein the common electrode line has a first sub-line extending in the first direction and a second sub-line extending in the second direction and located at a side of the intersection region away from the maintaining part; and
   wherein the maintaining part is configured to, when a breakage of the first signal line occurs in the intersection region, be electrically connected to a portion of the first signal line on one side of the breakage and be electrically connected to a portion of the first signal line on the other side of the breakage through an electrical connection with the common electrode line.

2. The array substrate according to claim 1, wherein the first signal line is a data line and the second signal line is a gate line.

3. The array substrate according to claim 2, wherein the maintaining part is disposed in a gate layer.

4. The array substrate according to claim 3, wherein the maintaining part is disposed in the gate layer below the data line.

5. A display apparatus, comprising the array substrate according to claim 2.

6. A method for maintaining a breakage of the first signal line in the array substrate according to claim 2, comprising:
   electrically connecting a portion of the first signal line on one side of the breakage to the maintaining part;
   electrically connecting a portion of the first signal line on the other side of the breakage to the common electrode line; and
   electrically insulating a portion of the common electrode line in a region including the intersection region from the surroundings.

7. The array substrate according to claim 1, wherein the maintaining part is substantially parallel to the second signal line.

8. A display apparatus, comprising the array substrate according to claim 7.

9. The array substrate according to claim 1, wherein the maintaining part and the common electrode line are made of the same material.

10. The array substrate according to claim 1, wherein the electrical connection is realized by welding.

11. A display apparatus, comprising the array substrate according to claim 1.

12. A method for maintaining a breakage of the first signal line in the array substrate according to claim 1, comprising:
   electrically connecting a portion of the first signal line on one side of the breakage to the maintaining part;
   electrically connecting a portion of the first signal line on the other side of the breakage to the common electrode line; and
   electrically insulating a portion of the common electrode line in a region including a connection area of the maintaining part and the common electrode line and a connection area of the first signal line and the common electrode line from the surroundings.

13. The method according to claim 12, wherein the electrical insulation is realized by cutting the portion of the common electrode line in the region from other portions of the common electrode line.

14. The method according to claim 12, wherein the region is a square region with a side length of 50 microns.

15. The array substrate according to claim 1, wherein the common electrode line has a grid structure including at least first common lines in the first direction and second common lines in the second direction intersecting with each other, wherein
   The maintaining part is electrically connected to a first common line.

16. The array substrate according to claim 15, wherein a connection area of the maintaining part and the first common line is away from a second common line by a distance less than ⅓ of a pixel length in the first direction.

17. A display apparatus, comprising the array substrate according to claim 15.

18. A display apparatus, comprising the array substrate according to claim 16.

19. A method for maintaining a breakage of the first signal line in the array substrate according to claim 15, wherein the breakage is located between the maintaining part and a second common line of the common electrode line, the method comprising:
- electrically connecting a portion of the first signal line on one side of the breakage to the maintaining part;
- electrically connecting a portion of the first signal line on the other side of the breakage to the second common line; and
- electrically insulating a portion of the common electrode line in a region a connection area of the maintaining part and the first common line, a connection area of the first signal line and the second common line, and an intersection area of the first common line and the second common line from the surroundings.

* * * * *